(12) United States Patent
Seyedi et al.

(10) Patent No.: US 10,502,900 B2
(45) Date of Patent: Dec. 10, 2019

(54) CWDM TRANSMIT MODULE FOR WAVELENGTH TUNING AND TRACKING

(71) Applicant: HEWLETT PACKARD ENTERPRISE DEVELOPMENT LP, Houston, TX (US)

(72) Inventors: Mir Ashkan Seyedi, San Francisco, CA (US); Di Liang, Santa Barbara, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/946,807

(22) Filed: Apr. 6, 2018

(65) Prior Publication Data

US 2019/0310422 A1 Oct. 10, 2019

(51) Int. Cl.
*G02B 6/293* (2006.01)
*H01S 5/00* (2006.01)
(Continued)

(52) U.S. Cl.
CPC ....... *G02B 6/29395* (2013.01); *G02B 6/2938* (2013.01); *H01S 5/0085* (2013.01); *H01S 5/021* (2013.01); *H01S 5/0261* (2013.01); *H01S 5/0687* (2013.01); *H01S 5/1071* (2013.01); *H01S 5/4087* (2013.01); *H04B 10/503* (2013.01); *H04B 10/506* (2013.01); *H04B 10/572* (2013.01); *H04J 14/021* (2013.01);
(Continued)

(58) Field of Classification Search
CPC . G02B 6/29395; G02B 6/2938; H01S 5/0085; H04B 10/503; H04B 10/506; H04B 10/572; H04J 14/021; H04J 14/0221

USPC .......................................................... 385/24
See application file for complete search history.

(56) References Cited

U.S. PATENT DOCUMENTS 9,389,365 B2 12/2016 Nicholson
2007/0110453 A1* 5/2007 Akiyama ........... G02B 6/12004
398/182
(Continued)

OTHER PUBLICATIONS

Efficient Wavelength Tuning Techniques for Integrated Silicon Photonics.
(Continued)

*Primary Examiner* — Jerry M Blevins
(74) *Attorney, Agent, or Firm* — Nolte Intellectual Property Law Group (57) ABSTRACT

A photonic integrated circuit (PIC) includes a semiconductor substrate with a main bus waveguide disposed within the substrate. Two or more ring lasers are disposed within the substrate and are optically coupled to the main bus waveguide. The ring lasers have a wavelength control mechanism allowing change of a lasers emitted wavelength. A wavelength selective filter is optically coupled to the bus waveguide. A control circuit is electronically coupled to each wavelength control mechanism, and the wavelength selective filter. The control circuit in conjunction with the selective filter allows monitoring of a ring laser's wavelength on the main bus waveguide. Based on a determined wavelength, the control circuit may change a ring laser wavelength to a desired wavelength to achieve a desired wavelength spacing for each of the ring lasers. The PIC may be integrated as a coarse wave-length division multiplexing (CWDM) transmit module.

21 Claims, 5 Drawing Sheets

(51) Int. Cl.
*H04B 10/50* (2013.01)
*H04B 10/572* (2013.01)
*H04J 14/02* (2006.01)
*H01S 5/02* (2006.01)
*H01S 5/10* (2006.01)
*H01S 5/40* (2006.01)
*H01S 5/0687* (2006.01)
*H01S 5/026* (2006.01)
*H01S 5/06* (2006.01)

(52) U.S. Cl.
CPC ......... *H04J 14/0221* (2013.01); *H01S 5/0617* (2013.01)

(56) References Cited

U.S. PATENT DOCUMENTS

| | | | |
|---|---|---|---|
| 2010/0055919 A1* | 3/2010 | Carothers | G02B 6/13 438/710 |
| 2015/0260521 A1 | 9/2015 | Osinski et al. | |
| 2015/0318665 A1 | 11/2015 | Liang | |
| 2015/0333479 A1 | 11/2015 | Liang et al. | |
| 2016/0049767 A1* | 2/2016 | Morton | H01S 3/083 372/20 |
| 2016/0329983 A1 | 11/2016 | Jones-Baehr | |
| 2017/0139236 A1 | 5/2017 | Cao | |
| 2017/0170895 A1 | 6/2017 | D'errico | |
| 2017/0331550 A1* | 11/2017 | Liu | H04B 10/07957 |

OTHER PUBLICATIONS

Silicon Photonic Transceiver Circuits With Microring Resonator Bias-Based Wavelength Stabilization in 65 nm CMOS.

Di Liang et al: "Electrically-pumped compact hybrid silicon microring lasers for optical intercinnects", Optics Express, Oct. 23, 2009 (Oct. 23, 2009), pp. 20355-20364, XP055615080, Retrieved from the Internet: URL:https://www.osapublishing.org/DirectPDFAccess/73F5A49C-9AD9-DDB6-08F3FECE24E2A4BF_188248/oe-17-22-20355.pdf?da=1&id=188248&seq=0&mobile=no [retrieved on Aug. 23, 2019].

European Search Report and Search Opinion Received for EP Application No. 19167233.6, dated Sep. 11, 2019, 7 pages.

Jifang Tao et al: "Demonstration of a compact wavelength tracker using a tunable silicon resonator", Optics Express, vol. 22, No. 28, Sep. 25, 2014 (Sep. 25, 2014), p. 24104, XP055615114, DOI: 10.1364/OE.22.824184.

* cited by examiner

CWDM TRANSMIT MODULE FOR WAVELENGTH TUNING AND TRACKING

This invention was made with Government support under Prime Contract No. DE-AC52-07NA27344 awarded by DOE. The Government has certain rights in this invention.

BACKGROUND

A coarse wave-length division multiplexing (CWDM) transmit module typically has 4, 8 or 16 channels. The CWDM laser wavelengths, for example, may cover a range of 1310 nm to 1610 nm with a spacing of 1-25 nm. A common spacing may be 1310 nm, 1330 nm, 1350 nm . . . , and so forth for 16 divisions based on a 20 nm separation. The CWDM transmit module combines the various laser wavelengths for transmission along fiber optic cables.

A CWDM transmit module may utilize ring lasers disposed in a semiconductor substrate. The main wavelength range of emission of each of the ring laser channels is determined by both the cavity design (ring radius) and the III-V semiconductor material (e.g. Al, GA, In and N, P As, Sb) and its associated gain spectrum.

Due to possible fabrication variation of the underlying silicon, thermal fluctuations and other process/fabrication fluctuations may occur. It may not be possible to absolutely and deterministically predict the wavelength of emission of a single laser cavity. Furthermore, it may be difficult to accurately and deterministically predict the relative channel spacing of a multi-wavelength system.

The ring laser wavelengths may need to be tuned to achieve specific spacing by shifting the emitted ring laser wavelengths to maintain or achieve a desired wavelength spacing. Furthermore, once tuned, it is desirable to allow the wavelength of emission to remain static even though environmental temperatures will change and thus cause a shift in the channel wavelength of emission.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Embodiments of the present disclosure are directed to a photonic integrated circuit (PIC) with an optical bus waveguide disposed within a semiconductor substrate. Two or more ring lasers are optically coupled to the bus waveguide with each ring laser having a local wavelength control mechanism that controls the output of the ring laser. A wavelength selective filter is optically coupled to the bus waveguide and the wavelength selective filter has a first photodetector connected to it. A control circuit is electronically coupled to each wavelength control mechanism, and the first photodetector. The. control circuit in conjunction with the selective filter allows monitoring of a ring laser's wavelength on the main bus waveguide.

Based on a determined wavelength spacing, the control circuit may change a ring laser wavelength to a desired wavelength to achieve a desired relative wavelength spacing for each of the ring lasers. The PIC may be integrated as a coarse wave-length division multiplexing (CWDM) transmit module.

In another embodiment of the present disclosure, a photonic integrated circuit (PIC) has a semiconductor substrate with a first surface and a second surface. An optical bus waveguide is disposed through the semiconductor substrate. At least four ring laser cavities are disposed within the semiconductor substrate. The ring cavities are optically coupled to the optical bus waveguide. Each of the laser cavities have a local wavelength control mechanism that controls the emitted wavelength of the laser cavity. A wavelength selective filter is optically coupled to the bus waveguide, and a photodetector. A control circuit is electronically coupled to each wavelength control mechanism, and the first photodetector.

In another embodiment of the present disclosure, the photonic integrated circuits described herein may perform a tuning process to calibrate and tune each of the ring lasers for a desired wavelength output. The PIC transmits a first wavelength through a bus waveguide using a first ring laser. The emission is received via a wavelength selective filter. A first photocurrent value for the wavelength is determined. Next, the PIC transmits a second wavelength through the bus waveguide using a second ring laser. The wavelength emission is received via the wavelength selective filter. A second photocurrent value for the wavelength is determined. The PIC control circuitry, or a separate processor, generates a map of each laser's wavelength of resonance as a function of the bias on the wavelength selective filter and the determined photocurrent value. The laser's wavelengths are determined whether they align with a channel spacing grid. The wavelength of the first ring laser, and the second ring laser, are adjusted to align the wavelengths to the channel spacing grid. For example, the PIC may cause the wavelength of the first ring laser blue-shift or red-shift its wavelength between 0.05 nm to 5 nm.

As described herein, the photonic integrated circuit and tuning process provides an on-chip wavelength tracking mechanism and adjustment process for dynamic wavelength tuning.

Figure 1:
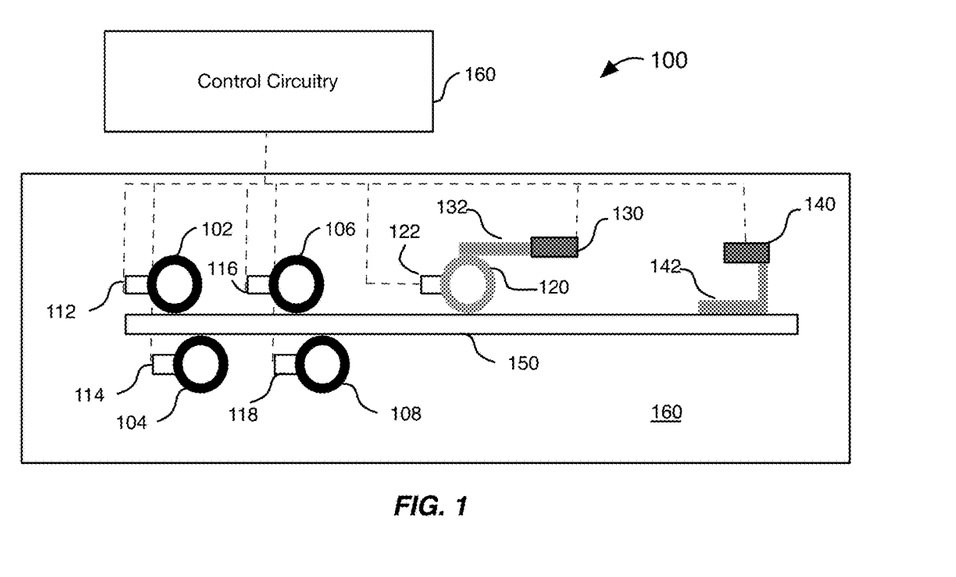
FIG. 1 is a diagram of an exemplary photonic integrated circuit for ring laser wavelength tuning according to one example of the principles described herein.

Referring to FIG. 1, a photonic integrated circuit providing for ring laser wavelength tuning is shown. FIG. 1 describes a schematic view of the photonic integrated circuit 100 having directly modulated ring lasers 102, 104, 106, 108, wavelength controllers 112, 114, 116, 118 for each laser, monitor ring filter 120 and associated photodetector 130 and total power monitor photodetector 140. A main bus waveguide 150 is disposed within a silicon substrate 160. The substrate has opposing surfaces. The bank of ring lasers 102, 104, 106, 108 are disposed within the silicon substrate 160, and are optically coupled to the main bus waveguide 150. The photonic integrated circuit 100 may be utilized as a multi-channel CWDM transmit module. The silicon substrate may be a layered substrate, such as a silicon/oxide/silicon substrate.

In the example shown, a bank of four ring lasers 102, 104, 106, 108 are optically coupled to the main bus waveguide 150. The output of the lasers 102, 104, 106, 108 is from a left to right direction as shown in FIG. 1. Other laser bank configurations may be utilized, for example 8, 16, etc. An even or odd number of lasers may be configured given the particular application of the circuit, and the desired wavelengths to be generated through the main bus wave guide 150. The rings laser 102, 104, 106, 108 have a cavity formed within the substrate 160. The wavelength of emission of the ring lasers is determined by the radius of the ring cavity and the gain spectrum of the integrated III-V laser material that may be used on top of the substrate and operation conditions.

Each of the lasers have a dedicated or local wavelength control mechanism 112, 114, 116, 118. The wavelength control mechanism 112, 114, 116, 118 adjusts the relative power of a respective laser to achieve a desired wavelength emission. The ring laser may be calibrated to a known bias. For example, one volt of electrical bias that is applied to one of the wavelength control mechanisms 112, 114, 116, 118 may cause a one nanometer shift. The ring lasers may be tuned to various channel spacing ranging from 0.5 nm to 5 nm to achieve a desired bandwidth and interoperability with optical transceivers.

A passive ring resonator cavity 120 is disposed within the substrate 160 and is optically coupled to the main bus waveguide 150. The passive ring resonator cavity 120 has a dedicated or a local wavelength control mechanism 122. This local wavelength control mechanism 122 acts as a local wavelength selective filter to extract light out of the main bus waveguide 150 for a desired wavelength. The local wavelength control mechanism 122 may be a local heater, injection diode, or metal-oxide-semiconductor (MOS) capacitor, all of which control the wavelength of emission of the ring laser by having a voltage applied to them. The wavelength control mechanism 122 may receive an electrical input causing a shift of the wavelength of resonance for the ring resonator cavity 120.

A local drop port waveguide bus 132, disposed within the substrate 160, routes the wavelength extracted from the main bus waveguide 150 to a photodetector 130, where the received optical signal is converted into an electrical signal. The electrical signal generated by the photodetector 130 may be previously correlated for particular wavelength so as to identify the evaluated wavelength from the main bus waveguide.

Another local drop port waveguide bus 142, or optical tap, is disposed within the substrate 160, and is coupled to photodetector 140. The optical tap may receive the integrated power of all of the ring lasers. This optical tap 142 is coupled to the main bus waveguide 150 and extracts a small percentage (e.g., 1-5%) of the total power across all wavelengths from the main bus waveguide 150. The local waveguide bus 142 and photodetector are configured together as a global wavelength monitor for the main bus waveguide 150.

One or more application-specific integrated circuits (ASICs) may be utilized with the described configuration to tune and/or track the specific wavelengths emitted from the respective ring lasers. This control circuitry 160 is electronically coupled to the each of the local wavelength control mechanisms 112, 114, 116, 118. The ASIC may be bonded to the substrate. The ASIC is configured to provide electrical signals to the electronically coupled components. The control circuitry 160 may be a single or multiple set of CMOS chips that are wire-bonded, flip-chipped, or otherwise co-packaged with the photonic integrated circuit as a CWDM Tx module. This packaged system will then allow for efficient and optimum power-on, wavelength calibration, locking/tuning and tracking.

Figure 2:
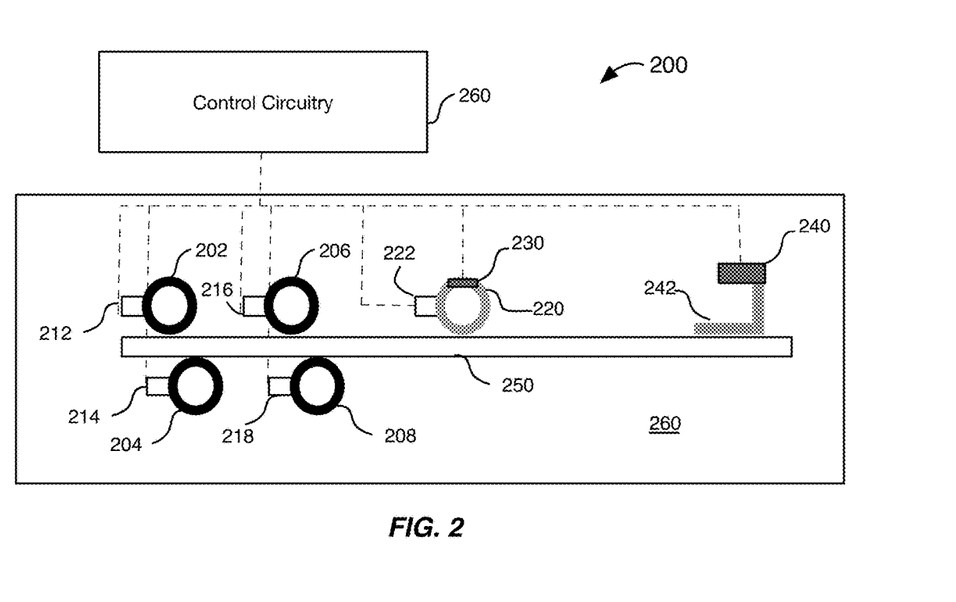
FIG. 2 is a diagram of an exemplary photonic integrated circuit for ring laser wavelength tuning according to one example of the principles described herein.

Referring to FIG. 2, another configuration for a photonic integrated circuit for wavelength tuning is shown. FIG. 2 describes a schematic view of a circuit 200 showing directly modulated ring lasers 202, 204, 206, 208, wavelength controllers, 212, 214, 216, 218 for each laser, monitor ring filter 220 and associated photodetector 230 and total power monitor photodetector 240.

This configuration operates similar to the described configuration of FIG. 1, however in the exemplary configuration in FIG. 2, the passive ring resonator cavity may integrate the photodetector material 230, such as Germanium, into the ring cavity 220 itself. The rectangle depicts an integrated photodetector material 230 that will absorb light. The photodetector material 230 is electronically coupled to the control circuitry 260.

The local wavelength control mechanism 222 controls the wavelength tuning for the cavity 220. This configuration with integrated photodetector material 230 may allow simpler manufacturing of the module 200 as compared to the configuration described in FIG. 1.

Another local waveguide 242, or optical tap, is disposed in the substrate. This optical tap 242 is coupled to the main bus waveguide 250 and extracts a small percentage (e.g., 1-5%) of the total power across all wavelengths from the main bus waveguide 250.

One or more application-specific integrated circuits (ASICs) may be utilized with the described configuration to tune and/or track the specific wavelengths emitted from the respective lasers. This control circuitry 260 is electronically coupled to the each of the local wavelength control mechanisms 212, 214, 216, 218.

Figure 3:
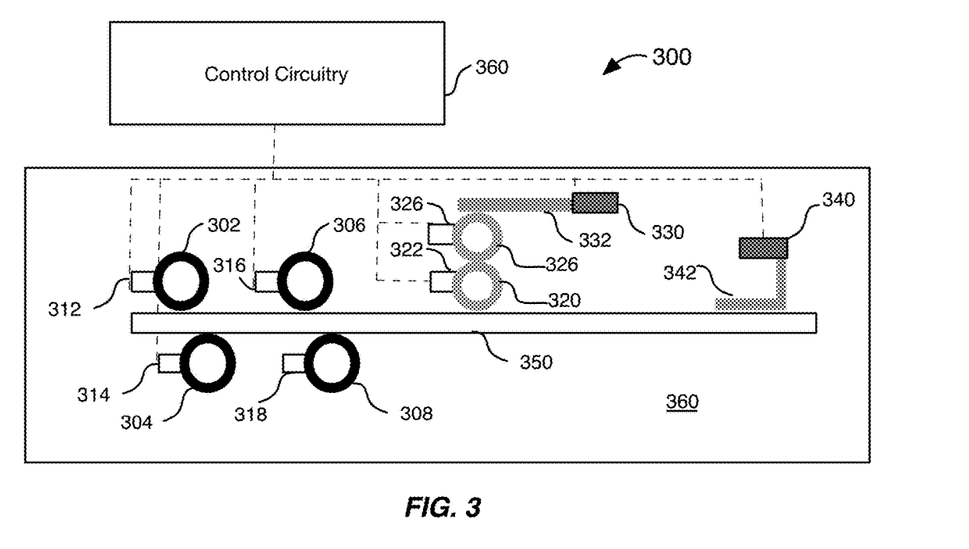
FIG. 3 is a diagram of an exemplary photonic integrated circuit for ring laser wavelength tuning according to one example of the principles described herein.

Referring to FIG. 3, another configuration for a photonic integrated circuit for wavelength tuning is shown. FIG. 3 describes a schematic view of the photonic integrated circuit 300 showing directly modulated ring lasers 302, 304, 306, 308, wavelength controllers 312, 314, 316, 318 for each laser, dual-ring filter 320, 324 and associated photodetector 330 and total power monitor photodetector 340.

An alternative configuration of a wavelength filter is a multiple ring coupled cavity. In the example, a dual-ring coupled cavity is shown by the rings 320, 324. The dual-ring coupled cavity 320, 324 allows for a wider passband for the optical signal obtained from the main bus waveguide 350, especially useful for a modulated signal. A tuning algorithm required to control the respective coupling and wavelength of resonance by the associated wavelength tuning components may be required.

Another local waveguide 342, or optical tap, is disposed within the substrate. This optical tap 342 is coupled to the main bus waveguide 350 and extracts a small percentage (e.g., 1% to 5%) of the total power across all wavelengths from the main bus waveguide 350.

The photonic integrated circuit referred to in FIGS. 1-3 may be integrated as a Coarse Wave-length Division Multiplexing (CWDM) transmit module. The same photonic integrated circuit for example, may be tuned for a particular channel spacing for use with different equipment require a particular spacing, such as 100 Ghz or 200 Ghz channel spacing.

Figure 4:
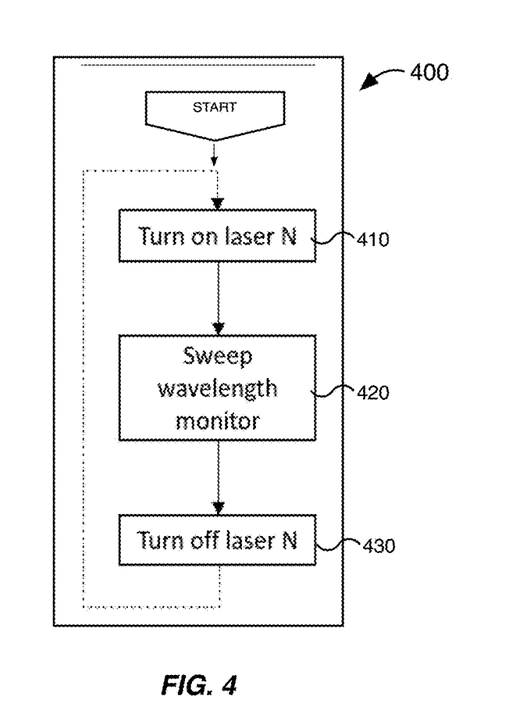
FIG. 4 is a diagram of a method flowchart illustrating initially evaluating ring lasers.

Now referring to FIG. 4, a high-level flow chart describes the basic steps in the initial power up phase for the ring lasers referred to in FIGS. 1-3. Each laser is powered on one by one and a resonant-cavity wavelength monitor is used to track the wavelength of resonance with respect to the applied bias on the wavelength monitor 410. As each laser is individually turned on, the bias on the wavelength monitor is swept through a known range based on its wavelength to bias response 420. After the sweep is performed, the laser is turned off 430. This evaluation is repeated for each of the lasers of the photonic integrated circuit. Values for the respective laser wavelengths, and laser voltage, may be stored in memory, or other non-transit storage medium for subsequent access and use. A table of all the bias points may be generated for each laser upon initial power up and for the peak output. The bias points may be evaluated to determine whether the bias points are appropriately spaced within desired spacing. A programmed or customized CMOS ASIC chip, or other integrated control circuitry, may be used to perform the process.

Figure 5:
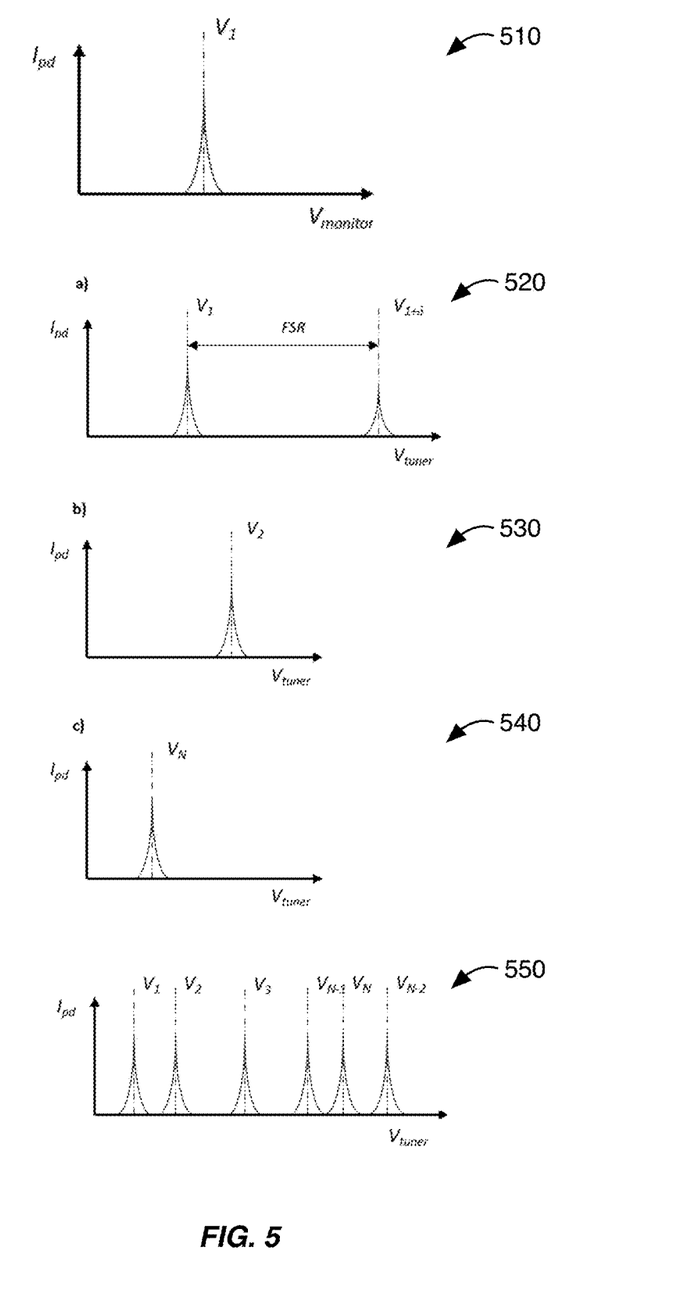
FIG. 5 are graphs illustrating photocurrent as a function of bias on a wavelength monitor.

FIG. 5 illustrates various graphs depicting photocurrent as a function of bias on a wavelength monitor. With respect to graph 510, the control circuitry, or other processor, may build a map for each laser's wavelength of resonance as a function of the bias on the wavelength monitor and the photocurrent detected. As depicted in graph 510, the current response at a specific bias denotes the initial wavelength of resonance of channel with respect to the applied bias on the global wavelength monitor module (V1 in this example for laser channel 1). After repeating this process for all the laser channels, the system may build a map of all the resonance wavelengths of the lasers with respect to the monitor.

With reference to graphs 520, 530 and 540, the graphs depict as a function of bias on wavelength monitor for a laser with multiple wavelengths of emission as determined by its free spectral range (FSR) and gain spectrum 520 and for other laser with longer 530, and shorter 540 wavelengths of emission. If the free spectral range (FSR) of the monitor is larger than that of the laser cavity, it might be possible for the wavelength monitor to pick out multiple resonance wavelengths from a single cavity. This is depicted in graph 520 by the two peaks. It should be noted that the second peak to the right has a slightly lower peak current value. This is determined by the gain spectrum of the laser cavity and the process can therefore determine that the first peak, denoted by V1 is the optimal wavelength of resonance to be used.

Once all the channels are mapped, the laser can be simultaneously turned on and if the wavelength monitor is swept, it will give the exemplary photocurrent response shown in graph 550. In this example, it should be noted that the current channel spacing is irregular between all of the neighboring channels and that it is possible for the channels to have their respective wavelengths of resonance out of order with respect to the physical layout of the channels as shown by the three wavelengths of resonance on the right of the graph 550. Once all of the lasers are powered on and calibrated in the aforementioned 'DC' regime, it will then be possible to modulate the lasers at a low data rate (1 kHz 1 MHz) with a known encoding scheme to broadcast the channel number and other relevant information that is needed for full link synchronization. The direct modulation of the laser can be done by either turning the laser itself on and off by biasing the laser below and above a threshold. The laser is fundamentally a diode and thus by modulation below/above the threshold, direct amplitude modulation can be implemented.

Figure 6:
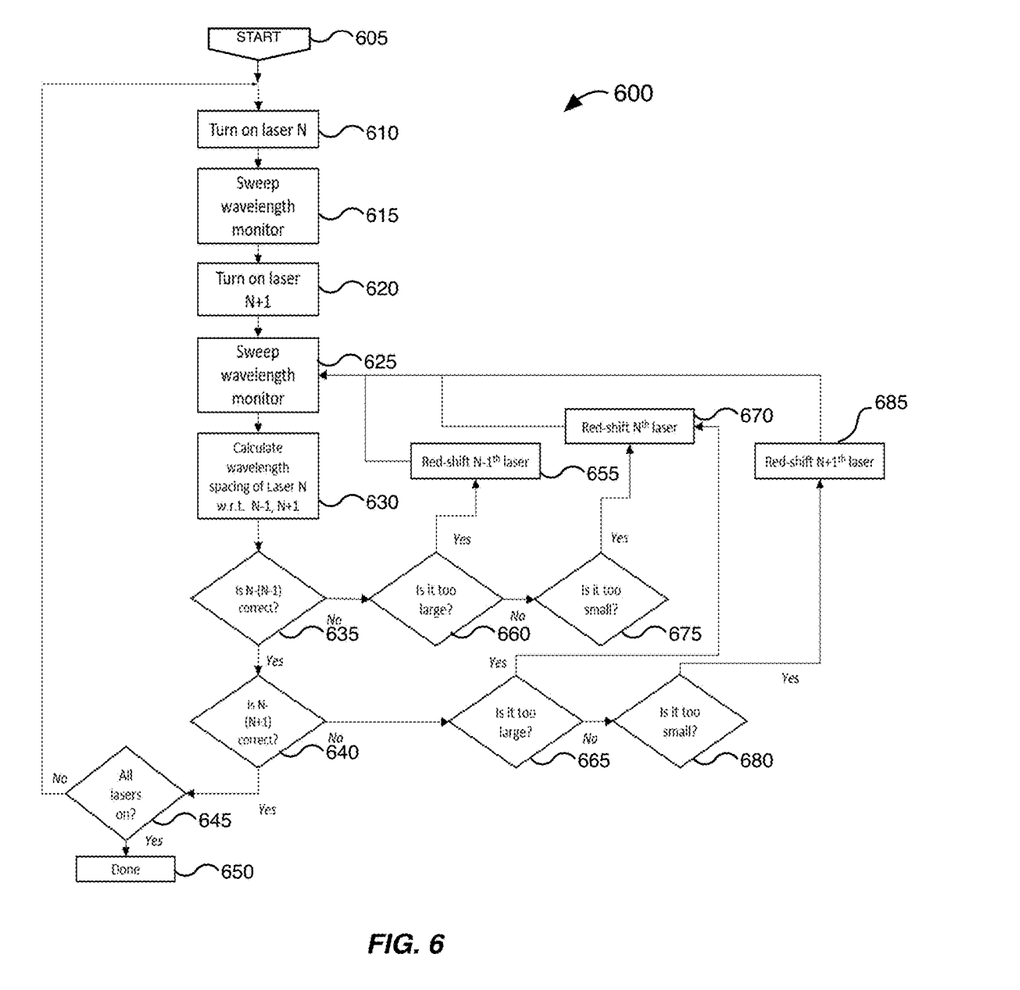
FIG. 6 is a diagram of a method flowchart illustrating tuning of a photonic integrated circuit.

Now turning to FIG. 6., a diagram of a method flowchart illustrates an exemplary tuning process 600 for the photonic integrated circuits as described herein. The flow chart describes a further detailed process to align the ring lasers to a desired wavelength spacing for a multi-channel CWDM ring laser transmitter. Each laser is powered on one by one and a resonant-cavity wavelength monitor as described above is used to track the wavelength of resonance with respect to the applied bias on the wavelength monitor. In step 610, an individual laser is powered on. In step 615, the bias on the wavelength monitor is swept through a known range based on its wavelength to bias response, and the laser's wavelength of emission is compared to its neighboring channels. In steps 620 and 625, these steps are repeated for as many laser channels as the transmit module to be evaluated. The integrated control electronics, such as a CMOS ASIC chip, may be utilized for implementing this process. A map for each of the laser's wavelength of resonance as a function of the bias on the wavelength monitor and the photocurrent detected with a calibrated response from the global wavelength monitor may be built and stored in system memory.

In step 635, the system evaluates whether a value for N−(N−1) is correct. If the value is not correct, then the system evaluates if the value is too large 660. If the value is too large, then in a red-shift N−1th laser is performed 645, and then the system continues with the sweep of the wavelength monitor 625. If the value is determined to be too small 675, then red-shift of Nth laser 670 is performed, and then the system continues with the sweep of the wavelength monitor 625.

In step 640, the system evaluates whether a value for N−(N+1) is correct. If the value is determined to be correct, then the system evaluates whether all lasers have been powered on to their operating state 645. If not, then the next laser is turned on 610, and the process continues for that laser. If the value from step 640 is determined to be incorrect, then the system determines if this value is either too large 665, or too small 680. If the value is too large, then a red-shift of Nth laser is performed 670, and the system continues with the sweep of the wavelength monitor 625. If the value is too small, then the system performs a red-shift of N+1th laser 685, and the system continues with the sweep of the wavelength monitor 625.

The tuning process is completed after all of the lasers have been evaluated 640.

Figure 7:
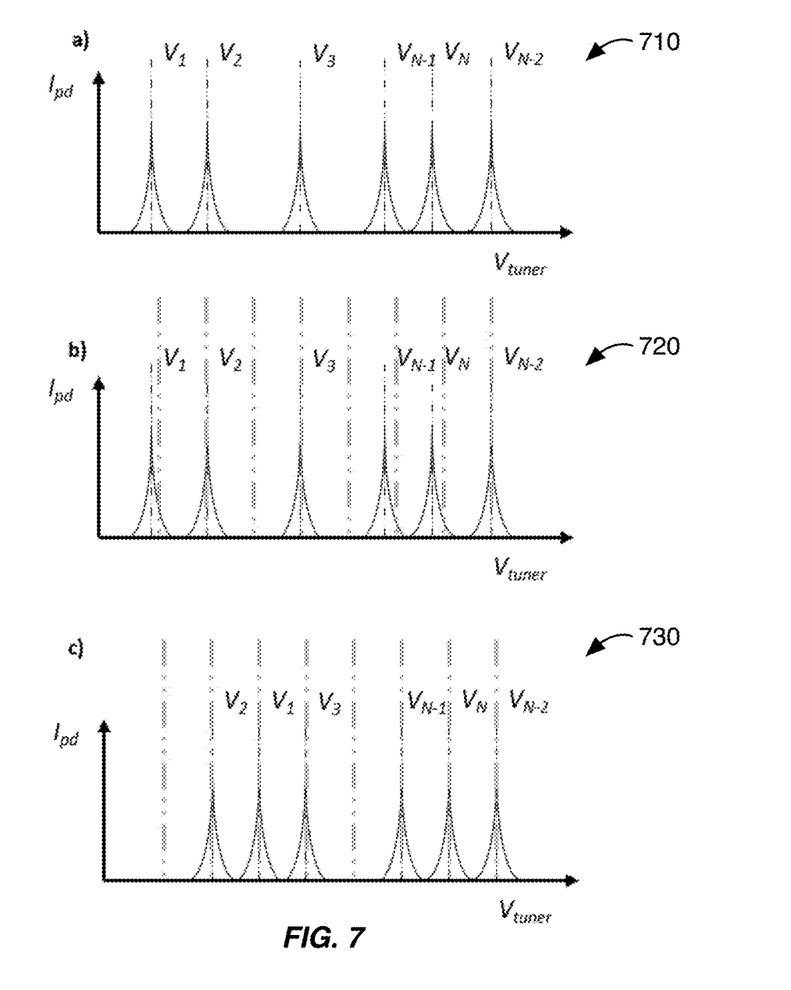
FIG. 7 are graphs illustrating photocurrent as a function of bias on a wavelength monitor.

Referring now to FIG. 7, diagrams of three graphs illustrate tuning of a laser transmit module using the photonic integrated circuit described herein. Graph 710 illustrates photocurrent as a function of bias on a wavelength monitor for each laser when the lasers is initially powered on to an operating state. The current response at a range of biases denotes the initial wavelength of resonance of each laser channel with respect to the applied bias, and as identified using a global wavelength monitor module.

Graph 720 illustrates how the lasers wavelengths are mapped to a desired channel spacing grid denoted by the dashed lines. The wavelength spacing is shown relative to the initial spacing of the lasers spectrally. For example, the grid may be a spacing of 10 nm.

Graph 730 illustrates how the laser wavelengths are aligned after the tuning process as described herein has been performed. This graph 730 illustrates an example of the final result of the tuning processing. The separation value of the grid may be a constant distant such as every 10 nm. The spacing may also be a custom grid with custom spacing values.

Additionally, graph 730 demonstrate some unique cases of the tuning processing to minimize power consumption of the system as well. For example, it can be noted that in going from the initial spacing to the final aligned condition, the order of the wavelengths for channels 1-3 have changed. In this example, this is because the wavelengths of resonance for channels 2 and 3 were initially 'on grid' and need not be tuned so as to minimize power consumption. Therefore, channel 1 was then tuned to be 'between' these channels spectrally. Once the channels are on-grid, the final spectral order of the ring laser channels can be determined by encoding a unique channel identifier signal onto each laser at a slow data rate. The process can then be continuously run while the link is transmitting data to maintain spectral alignment.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A photonic integrated circuit comprising:
a substrate;
an optical bus waveguide disposed through the substrate;
two or more ring lasers disposed within the substrate, the ring lasers optically coupled to the bus waveguide, each laser having a local wavelength control mechanism;
a wavelength selective filter optically coupled to the bus waveguide, the filter having a first photodetector; and
a control circuit electronically coupled to each wavelength control mechanism, and the first photodetector, wherein, in operation, the control circuit is configured to:
determine whether each laser's wavelength aligns with a channel spacing grid; and
control the wavelength control mechanisms to adjust the wavelength of the first ring laser, and the second ring laser, to align the wavelengths to the channel spacing grid.

2. The photonic integrated circuit of claim 1, wherein the wavelength selective filter is a passive ring resonator cavity disposed within the substrate.

3. The photonic integrated circuit of claim 2, wherein the first photodetector is a photodetector material integral to the passive ring resonator cavity.

4. The photonic integrated circuit of claim 1, wherein the wavelength selective filter is a multiple-ring coupled cavity disposed through the substrate.

5. The photonic integrated circuit of claim 1 further comprising:
a second photodetector optically coupled to the bus waveguide, wherein the second photodetector is electronically coupled to the control circuit.

6. The photonic integrated circuit of claim 1, wherein the wavelength control mechanism is one of a local heater, an injection diode, or a metal-oxide-semiconductor (MOS) capacitor.

7. The photonic integrated circuit of claim 1, wherein the control circuitry is configured to control operation of the wavelength selective filter.

8. The photonic integrated circuit of claim 1, wherein the wavelength selective filter is a pair of passive ring resonator cavities disposed within the substrate.

9. A photonic integrated circuit comprising:
a semiconductor substrate, comprising a first surface and a second surface;
an optical bus waveguide disposed through the semiconductor substrate;
at least four ring laser cavities disposed within the semiconductor substrate, the ring cavities optically coupled to the optical bus waveguide, each ring laser cavity comprising a portion of a respective laser and having a local wavelength control mechanism;
a wavelength selective filter optically coupled to the bus waveguide, the filter having a first photodetector; and
a control circuit electronically coupled to each wavelength control mechanism, and the first photodetector, wherein, in operation, the control circuit is configured to:
determine whether a respective laser's wavelength aligns with a channel spacing grid; and
control the wavelength control mechanisms to adjust the wavelength of the first ring laser, and the second ring laser, to align the wavelengths to the channel spacing grid.

10. The photonic integrated circuit of claim 9, wherein the wavelength selective filter is a passive ring resonator cavity disposed within the substrate.

11. The photonic integrated circuit of claim 10, wherein the first photodetector is a photodetector material integral to the passive ring resonator cavity.

12. The photonic integrated circuit of claim 9, wherein the wavelength selective filter is a multiple-ring coupled cavity disposed within the substrate.

13. The photonic integrated circuit of claim 9, further comprising:
a second photodetector optically coupled to the bus waveguide, wherein the second photodetector is electronically coupled to the control circuit.

14. The photonic integrated circuit of claim 9, wherein the wavelength control mechanism is one of a local heater, an injection diode, or a metal-oxide-semiconductor (MOS) capacitor.

15. The photonic integrated circuit of claim 9, wherein the control circuitry is configured to control operation of the wavelength selective filter.

16. The photonic integrated circuit of claim 9, wherein the wavelength selective filter is a pair of passive ring resonator cavities disposed within the substrate.

17. A method for tuning a photonic integrated circuit, the method comprising:
- transmitting a first wavelength emission through a bus waveguide using a first ring laser;
- receiving a portion of the wavelength emission using a wavelength selective filter;
- determining a first photocurrent value for the first wavelength emission;
- transmitting a second wavelength emission through the bus waveguide using a second ring laser;
- receiving a portion of the second wavelength emission using the wavelength selective filter;
- determining a second photo current value for the second wavelength emission;
- generating a map of each laser's wavelength of resonance as a function of the bias on the wavelength selective filter and the determined photocurrent values;
- determining whether each laser's wavelength aligns with a channel spacing grid; and
- adjusting the wavelength of the first ring laser, and the second ring laser, to align the wavelengths to the channel spacing grid.

18. The method of claim 17, further comprising:
adjusting the wavelength of the first ring laser to blue-shift the wavelength between 0.05 nm to 5 nm.

19. The method of claim 17, further comprising:
adjusting the wavelength of the first ring laser to red-shift the wavelength between 0.05 nm to 5 nm.

20. The method of claim 17, wherein
receiving the portion of the wavelength emission using the wavelength selective filter includes receiving the portion of the wavelength emission using a passive ring resonator cavity; and
receiving the portion of the second wavelength emission using the wavelength selective filter includes receiving the portion of the second wavelength emission using the passive ring resonator cavity.

21. The method of claim 17, wherein
receiving the portion of the wavelength emission using the wavelength selective filter includes receiving the portion of the wavelength emission using a first passive ring resonator cavity; and
receiving the portion of the second wavelength emission using the wavelength selective filter includes receiving the portion of the second wavelength emission using a second passive ring resonator cavity.

* * * * *